US006941504B2

(12) United States Patent
Berry, Jr. et al.

(10) Patent No.: US 6,941,504 B2
(45) Date of Patent: Sep. 6, 2005

(54) METHOD AND APPARATUS FOR TEST CASE EVALUATION USING A CYCLIC REDUNDANCY CHECKER

(75) Inventors: Robert Walter Berry, Jr., Round Rock, TX (US); Michael Criscolo, Cedar Park, TX (US); Pedro Martin-de-Nicolas, Austin, TX (US); Charles Leverett Meissner, Austin, TX (US); Michael Timothy Saunders, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 478 days.

(21) Appl. No.: 09/998,399

(22) Filed: Nov. 15, 2001

(65) Prior Publication Data

US 2003/0093743 A1 May 15, 2003

(51) Int. Cl.[7] .............................................. H03M 13/00
(52) U.S. Cl. ...................................................... 714/758
(58) Field of Search ................................. 714/758, 718, 714/702, 776, 754, 763, 764, 819; 370/914, 395.42, 412; 365/200, 238.5

(56) References Cited

U.S. PATENT DOCUMENTS

| | | | | |
|---|---|---|---|---|
| 4,907,278 A | * | 3/1990 | Cecinati et al. | 704/246 |
| 5,127,014 A | * | 6/1992 | Raynham | 714/754 |
| 5,432,748 A | * | 7/1995 | Hsu et al. | 711/100 |
| 5,751,741 A | * | 5/1998 | Voith et al. | 714/758 |
| 6,549,537 B2 | * | 4/2003 | Kunito et al. | 370/395.42 |
| 6,647,528 B1 | * | 11/2003 | Collette et al. | 714/758 |
| 6,668,196 B1 | * | 12/2003 | Villegas et al. | 607/60 |

* cited by examiner

Primary Examiner—Guy J. Lamarre
(74) Attorney, Agent, or Firm—Carr LLP; Diana R. Gerhardt

(57) ABSTRACT

The present invention provides an apparatus and a method for testing one or more electrical components. The apparatus and method provide a CRC function that is used to calculate a CRC value for a portion of memory. The CRC value is compared with an expected CRC value to determine if the electrical component passed or failed the test.

23 Claims, 4 Drawing Sheets

METHOD AND APPARATUS FOR TEST CASE EVALUATION USING A CYCLIC REDUNDANCY CHECKER

BACKGROUND OF THE INVENTION

1. Field of the Invention

The invention relates generally to computer architectures and, more particularly, to a method and an apparatus for testing electronic components.

2. Description of Related Art

Testing of hardware and software generally involves executing a set of instructions and/or commands and comparing the actual results with the expected results. If the actual results match the expected results, the test case was successful. If the actual results do not match the expected results, then the test case failed.

In order to make this determination, however, generally requires capturing large amounts of data, such as a memory dump, transferring the data from the test machine to a host machine, and comparing the data with the expected results. This process is time and resource intensive.

Therefore, there is a need to provide a method and an apparatus to efficiently assist in evaluating test case results.

SUMMARY

The present invention provides an apparatus and a method for testing one or more electrical components. The apparatus and method comprises executing a test on the electrical component and calculating a Cyclic Redundancy Checker (CRC) value for a predetermined portion of memory. The CRC value is compared with an expected CRC value to determine if the test was successful.

BRIEF DESCRIPTION OF THE DRAWINGS

For a more complete understanding of the present invention, and the advantages thereof, reference is now made to the following description taken in conjunction with the accompanying drawings, in which.

DETAILED DESCRIPTION

In the following discussion, numerous specific details are set forth to provide a thorough understanding of the present invention. However, it will be obvious to those skilled in the art that the present invention may be practiced without such specific details. In other instances, well-known elements have been illustrated in schematic or block diagram form in order not to obscure the present invention in unnecessary detail. Additionally, for the most part, details concerning the physical implementation and connectivity of the invention, and the like, have been omitted inasmuch as such details are not considered necessary to obtain a complete understanding of the present invention, and are considered to be within the skills of persons of ordinary skill in the relevant art.

It is further noted that, unless indicated otherwise, all functions described herein may be performed in either hardware or software, or some combination thereof. In a preferred embodiment, however, the functions are implemented in hardware in order to provide the most efficient implementation. Alternatively, the functions may be performed by a processor such as a computer or an electronic data processor in accordance with code such as computer program code, software, and/or integrated circuits that are coded to perform such functions, unless indicated otherwise.

Figure 1:
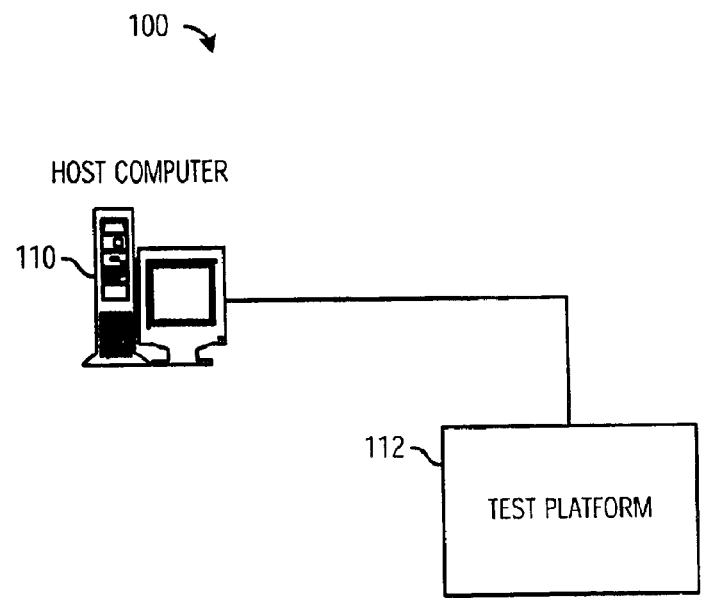
FIG. 1 is a schematic diagram of a typical testing environment that embodies the present invention.

Referring to FIG. 1 of the drawings, the reference numeral 100 generally designates a test system embodying features of the present invention. The test system 100 generally comprises a host computer 110, such as a Workstation Model 270 manufactured by IBM, Corp., connected to a test platform 112. The host computer 110 is configured to provide test case information to the test platform 112 and to receive test case results from the test platform 112. A preferred embodiment of the test platform 112 is more particularly described in copending and coassigned U.S. patent application Ser. No. 09/998,390, entitled "Method and System for Testing Electronic Components", which is incorporated by reference herein for all purposes. For purposes of illustration and to clearly describe the present invention, however, a simplified embodiment is discussed below with reference to FIG. 2.

Figure 2:
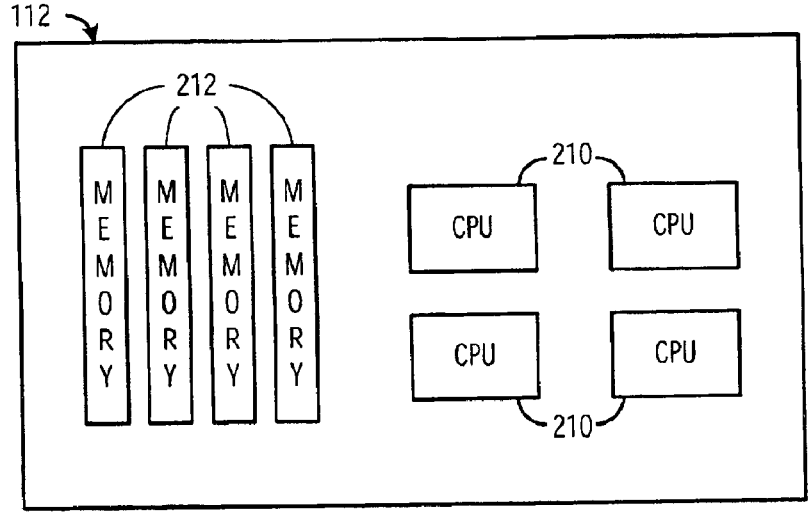
FIG. 2 is a block diagram illustrating one embodiment of the present invention in which a test platform is used to test an electrical component.

FIG. 2 is a block diagram depicting the components that preferably comprise the test platform 112 in accordance with one embodiment of the present invention. Accordingly, the test platform 112 generally comprises one or more devices under test (DUTs), such as CPUs 210, and one or more memories 212. Other components, such as a bus arbiter, I/O chipset, debug connectors, and the like, which may be necessary for the operation of the present invention, are considered well known to a person of ordinary skill in the art, and, therefore, are neither shown nor discussed in greater detail.

The CPUs 210 are configured to perform test cases supplied by the host computer 110 (FIG. 1). The memories 212, preferably Dual In-line Memory Modules (DIMMs), Single In-line Memory Modules (SIMMs), or the like, provide memory for the execution of the test cases and storage of the test case results. In a preferred embodiment, one or more of the memories 212 are replaced with a Cyclic Redundancy Checker in a Multiple Instruction Shift Register (CRC-MISR) card, which is discussed in greater detail below with reference to FIG. 3.

Figure 3:
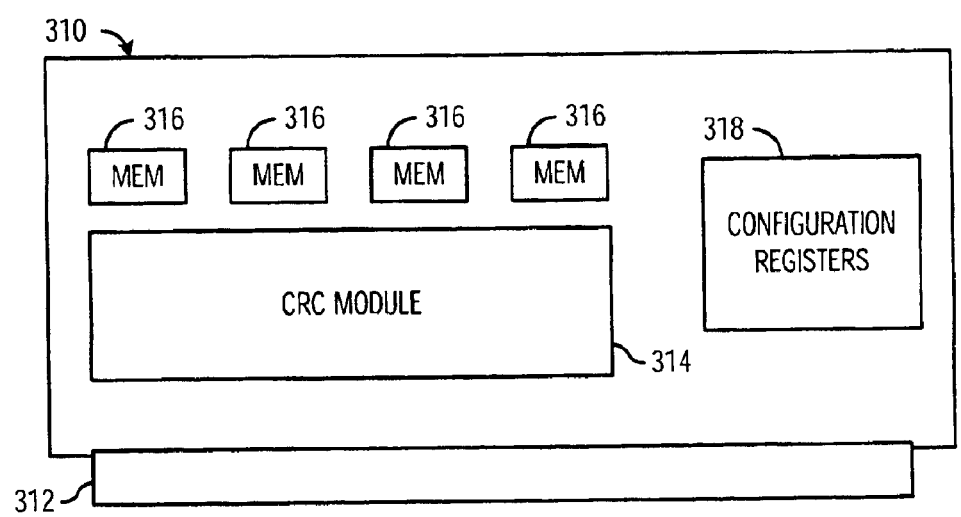
FIG. 3 is a block diagram illustrating one embodiment of the present invention in which a Cyclic Redundancy Checker (CRC) is placed on a memory card.

FIG. 3 is a block diagram depicting the components that preferably comprise a CRC-MISR card in accordance with one embodiment of the present invention. Accordingly, reference numeral 300 generally designates a CRC-MISR card that may be substituted for one or more of the memories 212 (FIG. 2). In the preferred embodiment, the memories 212 are DIMMs, and, therefore, the CRC-MISR card 300 preferably comprises a DIMM-form factor card 310, including a standard DIMM connector 312, configured with a CRC module 314, configuration registers 318, and, optionally, memories 316.

The CRC module 314 determines a CRC value by executing a CRC algorithm on for a range of addresses as specified by the configuration registers 318 and stores the CRC value in the one or more memories 212. Preferably, the host computer 110 (FIG. 1) configures the configuration registers 318 to specify the address range, i.e., a minimum and maximum address, and an accumulation trigger, such as on read and write transactions, read-only transactions, write-only transactions, and the like. Additionally, it is preferable to allow the host computer 110 to set the configuration registers 318 such that the CRC module 314 is disabled and/or the CRC performs a self-test on a memory segment.

Furthermore, the CRC module 314 is configured to store the result in the one or more memories 316 and/or directly to system memory 212. The result may be transferred to the host computer 110 upon request, at which time the host computer may compare the actual result with the expected result. Alternatively, the host computer 110 may transfer the expected results to the memories 316 and/or 212 and configure the CRC function 314 to compare the actual results to the expected results upon completion of a test. This alternative implementation allows for the ability to only notify and/or send data to the host computer 110 upon a failed test.

CRC algorithms, and their hardware and/or software implementations, are well known in the industry. The use of the CRC algorithms with the present invention, therefore, will be obvious to a person of ordinary skill in the art upon a reading of the present disclosure, and will not be discussed in greater detail except insofar as is necessary to adequately describe the present invention.

Figure 4:
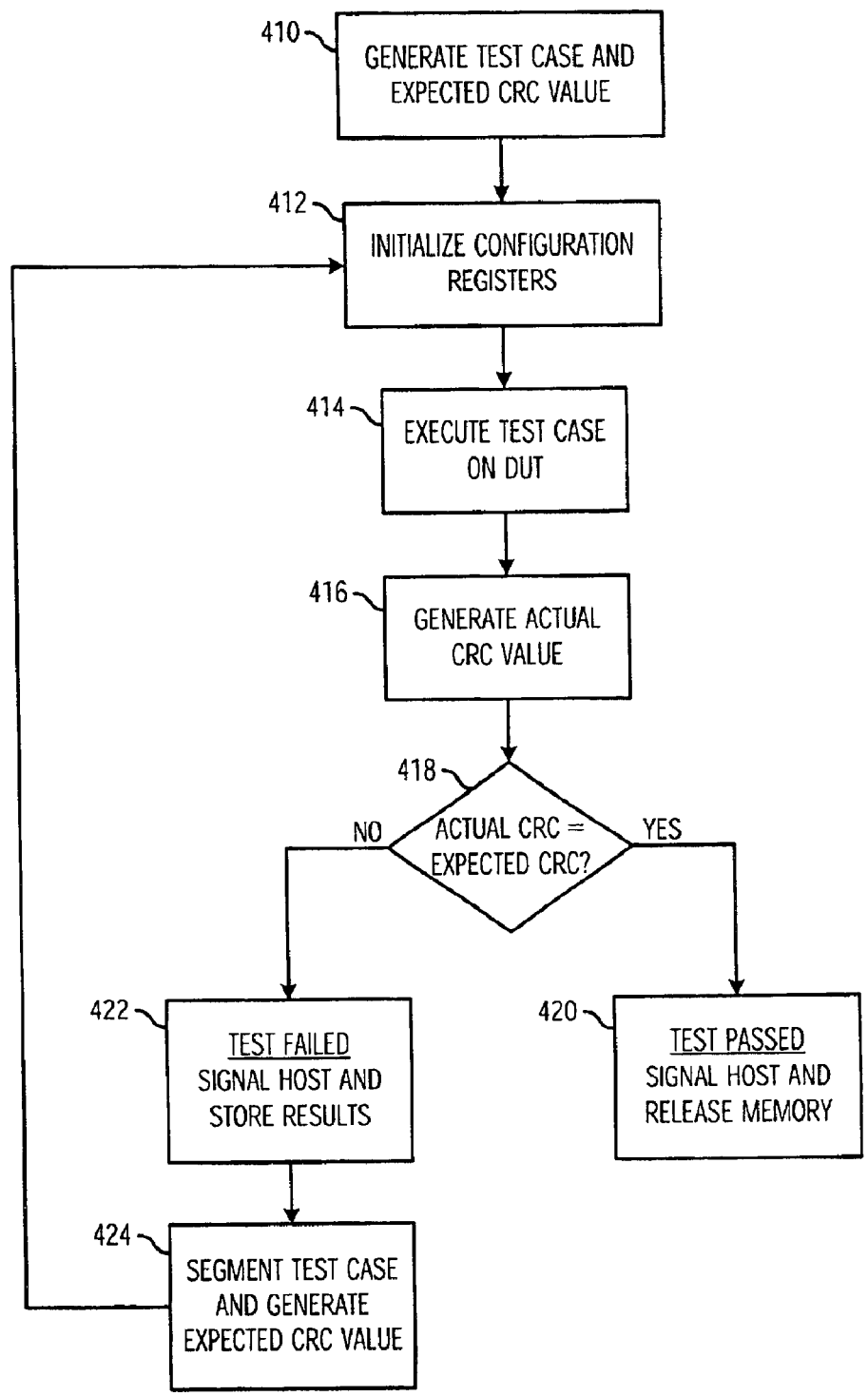
FIG. 4 is a data flow diagram illustrating one embodiment of the present invention in which a CRC function is utilized to determine if an electrical component successfully passed a test.

FIG. 4 is a flow chart depicting steps that may be performed by the test system 100 in accordance with one embodiment of the present invention that determines whether a DUT, i.e., CPUs 210 has successfully passed a test case. Processing begins in step 410, wherein a test case is generated and an expected CRC value is determined, preferably by the host computer 110. Processing proceeds to step 412, wherein the host computer 110 initializes the configuration registers 318 on the CRC-MISR 310. As discussed above, it is preferred that the host computer 110 initializes the configuration registers 318 to specify the memory range and the type of transaction. Thereafter, in step 414, the test case is performed on the DUT.

After the test case is performed by the DUT, in step 416 the CRC function 314 determines the actual CRC value from the memories 212 (FIG. 2). In step 418, a determination is made whether the actual CRC value matches the expected CRC value. The determination may be made by either the CRC-MISR card 310 or the host computer 110, as is discussed above. If, in step 418, a determination is made that the actual CRC value matches the expected CRC value, then processing proceeds to step 420, wherein the test is indicated as passed and the memory is released. If, however, in step 418, a determination is made that the actual CRC value does not match the expected CRC value, then processing proceeds to step 422, wherein the test is indicated as failed and results are stored, either in the memory 316 (FIG. 3), the memory 212 (FIG. 2), or the host computer 110.

In step 424, the failed test case is optionally segmented and the expected CRC value recalculated. Segmenting a test case is a method used to narrow the failing condition by taking subsets of the failed test case to determine the specific area in which the DUT fails. After segmenting the test case and recalculating the expected CRC value, processing returns to step 412, wherein the test case is processed.

Alternatively, an expected CRC value may be calculated over a different range of memory. Instead of re-executing the test case or running a different test case, an actual CRC value may be calculated and compared to the expected CRC value. In this manner, further debugging may be performed by inspecting multiple sections of memory after executing a single test case to further determine specific problem areas.

Figure 5:
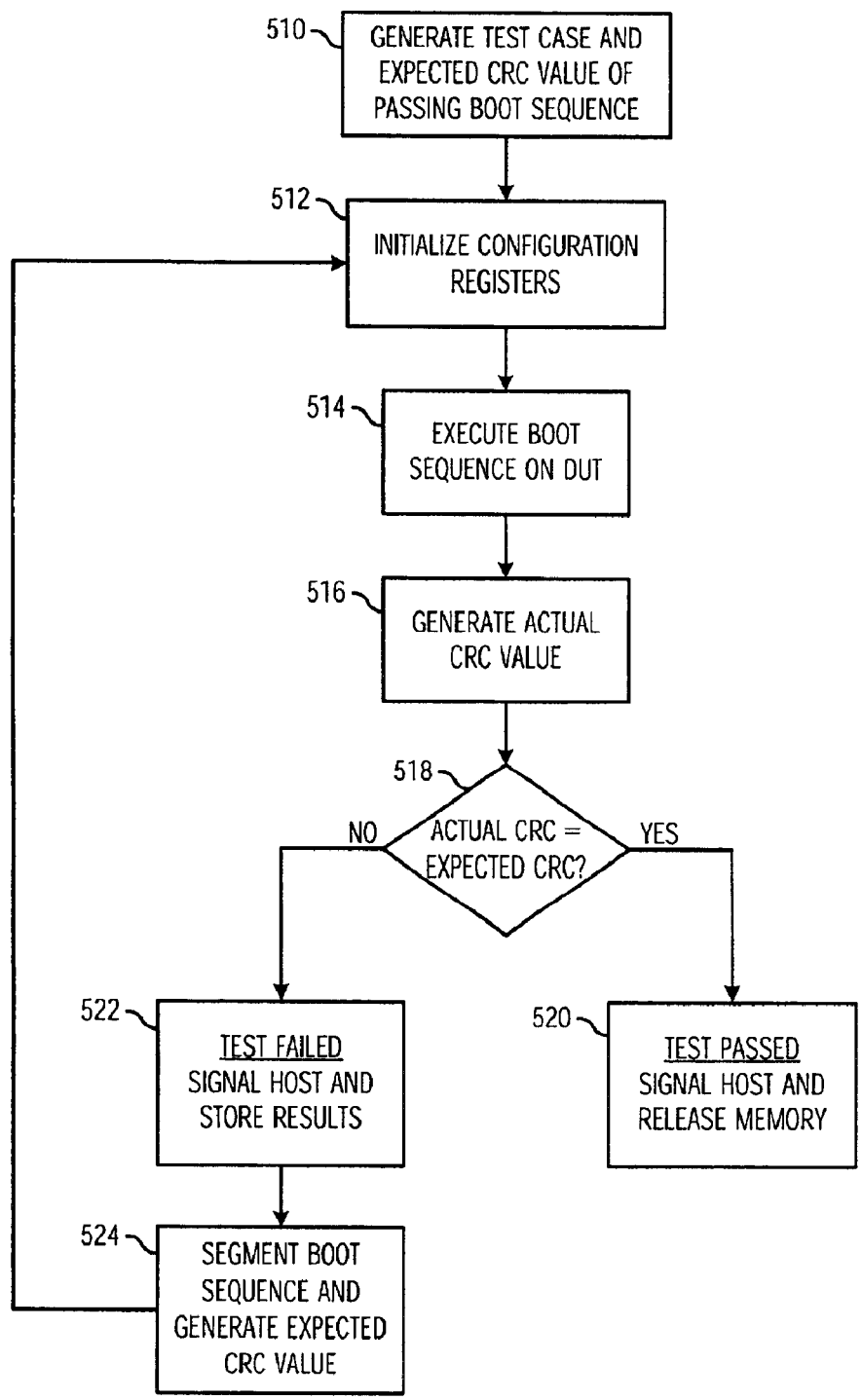
FIG. 5 is a data flow diagram illustrating one embodiment of the present invention in which a CRC function is utilized to determine if a Central Processing Unit (CPU) has successfully passed a boot-up sequence.

FIG. 5 is a flow chart depicting steps that may be performed by the test system 100 in accordance with another embodiment of the present invention that determines whether a DUT has successfully passed a boot-up sequence. One particular problem addressed by the present invention is the problem of determining whether a boot up sequence of a DUT such as a CPU has executed properly, and, if not, where in the boot up process the DUT failed. Accordingly, beginning in step 510, intermediate expected CRC values of a passing boot-up sequence are determined, preferably by the host computer 110. Processing proceeds to step 512, wherein the host computer 110 initializes the configuration registers 318 on the CRC-MISR 310. As discussed above, it is preferred that the host computer 110 initialize the configuration registers 318 to specify the memory range and the type of transaction. Thereafter, in step 514, the test case is performed on the DUT.

After the test case is performed by the DUT, in step 516 the CRC function 314 determines the actual CRC value from the memories 212 (FIG. 2). In step 518, a determination is made whether the actual CRC value matches the expected CRC value. The determination may be made by either the CRC-MISR card 310 or the host computer 110, as is discussed above. If, in step 518, a determination is made that the actual CRC value matches the expected CRC value, then processing proceeds to step 520, wherein the test is indicated as passed and the memory is released. If, however, in step 518, a determination is made that the actual CRC value does not match the expected CRC value, then processing proceeds to step 522, wherein the test is indicated as failed and results are preferably stored, either in the memory 316 (FIG. 3), the memory 212 (FIG. 2), or the host computer 110, for analysis.

In step 524, the failed test case is optionally segmented and the expected CRC value recalculated, and processing returns to step 512, wherein the segmented test case is processed.

It should be noted that the foregoing disclosure discusses the invention in terms of the preferred embodiment in which the host computer is an external host computer configured to control the execution of test cases and the like. The invention, however, is equally applicable to the situation in which the host computer does not exist and the CRC-MISR cards are inserted into a stand-alone system, such as replacing one or more memory cards of a personal computer (PC) with one or more CRC-MISR cards. In this situation, the CPU of the stand-alone system preferably performs the functions of the host computer and application programs may be written to test various aspects of the hardware/software design, the results of which may be determined as described above. The use of the present invention in such an environment is considered to be within the skills of a person of ordinary skill in the art upon a reading of the present disclosure.

It is understood that the present invention can take many forms and embodiments. Accordingly, several variations may be made in the foregoing without departing from the spirit or the scope of the invention. For example, additional monitors may be utilized to monitor bus traffic and/or detect errors in specific cycles.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered obvious and desirable by those skilled in the art based upon a review of the foregoing description of preferred embodiments. Accordingly, it is appropriate that the appended claims be construed broadly and in a manner consistent with the scope of the invention.

What is claimed is:

1. A method of testing an electrical component, the method comprising the steps of:
   performing a first test in a known environment;
   calculating an expected Cyclic Redundancy Checker (CRC) value over a predetermined amount of memory after completion of the first test;
   performing a second test on a device under test, the second test being substantially equivalent to the first test;
   calculating an actual CRC value over a predetermined amount of memory after completion of the second test;
   determining whether the expected CRC is substantially equivalent to the actual CRC;
   upon a determination that the expected CRC is substantially equivalent to the actual CRC, indicating that the electrical component passed the second test; and
   upon a determination that the expected CRC is not substantially equivalent to the actual CRC, indicating that the electrical component failed the second test.

2. The method of claim 1, further comprising the step, upon a determination that the expected CRC is not substantially equivalent to the actual CRC, of performing the substeps of:
   segmenting the first test case to create a segmented test case.

3. The method of claim 1, wherein the first test is performed on a host computer.

4. The method of claim 1, wherein the second test is performed on at least one of a Dual In-line Memory Module (DIMM) and a Single In-line Memory Module (SIMM).

5. The method of claim 1, wherein the electrical component is a Central Processing Unit (CPU).

6. The method of claim 1, wherein the first test and the second test are boot sequences of a Central Processing Unit (CPU).

7. A method of testing a Central Processing Unit (CPU), the method comprising the steps of:
   performing a test on the CPU;
   calculating an actual Cyclic Redundancy Checker (CRC) value for a predetermined amount of memory;
   determining whether the CRC value is substantially equivalent to an expected CRC value;
   upon a determination that the expected CRC value is substantially equivalent to the actual CRC value, indicating that the CPU passed the test; and
   upon a determination that the expected CRC value is not substantially equivalent to the actual CRC value, indicating that the CPU failed the test.

8. The method of claim 7, wherein the test is performed on at least one of a Dual In-line Memory Module (DIMM) and a Single In-line Memory Module (SIMM).

9. An memory module card comprising:
   a Cyclic Redundancy Checker (CRC) for determining a CRC value for a predetermined portion of memory;
   one or more configuration registers for specifying the predetermined portion of memory; and
   one or more internal memories for use by the CRC.

10. The memory module of claim 9, wherein the memory module card is at least one of a Dual In-line Memory Module (DIMM) and a Single In-line Memory Module (SIMM).

11. An apparatus for testing an electrical component, the apparatus comprising:
    means for performing a first test in a known environment;
    means for calculating an expected Cyclic Redundancy Checker (CRC) value over a predetermined amount of memory after completion of the first test;
    means for performing a second test on a device under test, the second test being substantially equivalent to the first test;
    means for calculating an actual CRC value over a predetermined amount of memory after completion of the second test;
    means for determining whether the expected CRC value is substantially equivalent to the actual CRC value;
    upon a determination that the expected CRC value is substantially equivalent to the actual CRC value, means for indicating that the electrical component passed the second test; and
    upon a determination that the expected CRC value is not substantially equivalent to the actual CRC value, means for indicating that the electrical component failed the second test.

12. The apparatus of claim 11, further comprising, upon a determination that the expected CRC value is not substantially equivalent to the actual CRC value:
    means for segmenting the first test case to create a segmented test case.

13. The apparatus of claim 11, wherein the means for performing the first test comprises a host computer.

14. The apparatus of claim 11, wherein the means for performing the second test comprises at least one of a Dual In-line Memory Module (DIMM) and a Single In-line Memory Module (SIMM).

15. The apparatus of claim 11, wherein the electrical component is a Central Processing Unit (CPU).

16. The apparatus of claim 11, wherein the first test and the second test are boot sequences of a Central Processing Unit (CPU).

17. An apparatus for testing a Central Processing Unit (CPU), the apparatus comprising:
    means for performing a test on the CPU;
    means for calculating an actual Cyclic Redundancy Checker (CRC) value for a predetermined amount of memory;
    means for determining whether the actual CRC value is substantially equivalent to an expected CRC value;
    upon a determination that the expected CRC value is substantially equivalent to the actual CRC value, means for indicating that the CPU passed the test; and
    upon a determination that the expected CRC value is not substantially equivalent to the actual CRC value, means for indicating that the CPU failed the test.

18. The apparatus of claim 17, wherein the means for performing the test comprises on at least one of a Dual In-line Memory Module (DIMM) and a Single In-line Memory Module (SIMM).

19. A computer program product for testing an electrical component, the computer program product having a medium with a computer program embodied thereon, the computer program comprising:

computer program code for performing a first test in a known environment;

computer program code for calculating an expected Cyclic Redundancy Checker (CRC) value over a predetermined amount of memory after completion of the first test;

computer program code for performing a second test on a device under test, the second test being substantially equivalent to the first test;

computer program code for calculating an actual CRC value over a predetermined amount of memory after completion of the second test;

computer program code for determining whether the expected CRC is substantially equivalent to the actual CRC;

computer program code for, upon a determination that the expected CRC is substantially equivalent to the actual CRC, indicating that the electrical component passed the second test; and computer program code for, upon a determination that the expected CRC is not substantially equivalent to the actual CRC, indicating that the electrical component failed the second test.

20. The computer program product of claim 19, further comprising computer program code for, upon a determination that the expected CRC is not substantially equivalent to the actual CRC, comprising:

computer program code for segmenting the first test case to create a segmented test case.

21. The computer program product of claim 19, wherein the electrical component is a Central Processing Unit (CPU).

22. The computer program product of claim 19, wherein the first test and the second test are boot sequences of a Central Processing Unit (CPU).

23. A computer program product for testing a Central Processing Unit (CPU), the computer program product having a medium with a computer program embodied thereon, the computer program comprising:

computer program code for performing a test on the CPU;

computer program code for calculating an actual Cyclic Redundancy Checker (CRC) value for a predetermined amount of memory;

computer program code for determining whether the CRC value is substantially equivalent to an expected CRC value;

computer program code for, upon a determination that the expected CRC value is substantially equivalent to the actual CRC value, indicating that the CPU passed the test; and computer program code for, upon a determination that the expected CRC value is not substantially equivalent to the actual CRC value, indicating that the CPU failed the test.

* * * * *